(12) United States Patent
Wang et al.

(10) Patent No.: US 7,795,101 B2
(45) Date of Patent: Sep. 14, 2010

(54) METHOD OF FORMING A MOS TRANSISTOR

(75) Inventors: Hsiang-Ying Wang, Chia-Yi Hsien (TW); Chin-Cheng Chien, Tainan Hsien (TW); Tsai-Fu Hsiao, Tainan (TW); Ming-Yen Chien, Kao-Hsiung Hsien (TW); Chao-Chun Chen, Kao-Hsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/701,612

(22) Filed: Feb. 8, 2010

(65) Prior Publication Data
US 2010/0144110 A1    Jun. 10, 2010

Related U.S. Application Data

(63) Continuation-in-part of application No. 12/127,787, filed on May 27, 2008, which is a continuation-in-part of application No. 11/278,434, filed on Apr. 3, 2006, now Pat. No. 7,396,717.

(51) Int. Cl.
*H01L 21/336* (2006.01)
(52) U.S. Cl. ............... 438/305; 438/528; 257/E21.437
(58) Field of Classification Search ............... 438/301, 438/302, 303, 305, 306, 307, 528, 529; 257/E21.437
See application file for complete search history.

(56) References Cited

U.S. PATENT DOCUMENTS

| | | | |
|---|---|---|---|
| 5,908,313 A | 6/1999 | Chau | |
| 5,959,333 A | 9/1999 | Gardner | |
| 6,037,640 A * | 3/2000 | Lee | ............ 257/408 |
| 6,232,166 B1 | 5/2001 | Ju | |
| 6,303,450 B1 | 10/2001 | Park | |
| 6,391,731 B1 | 5/2002 | Chong | |
| 6,537,886 B2 * | 3/2003 | Lee | ............ 438/306 |
| 6,682,980 B2 | 1/2004 | Chidambaram | |
| 6,812,253 B2 * | 11/2004 | Wohlfart et al. | ............ 514/617 |
| 7,105,427 B1 * | 9/2006 | Chu et al. | ............ 438/530 |
| 7,109,099 B2 * | 9/2006 | Tan et al. | ............ 438/527 |
| 7,400,018 B2 * | 7/2008 | Tan et al. | ............ 257/399 |
| 7,482,255 B2 * | 1/2009 | Graoui et al. | ............ 438/528 |
| 7,498,642 B2 * | 3/2009 | Chen et al. | ............ 257/408 |
| 7,622,372 B1 * | 11/2009 | Chu et al. | ............ 438/511 |
| 7,642,150 B2 * | 1/2010 | Arevalo et al. | ............ 438/215 |

(Continued)

OTHER PUBLICATIONS

Ellis-Monaghan, J., Kam-Leung Lee, Meikei Ieong, Yang, I.,"Carbon Implanted Halo for Super Halo characteristic NFETs in Bulk and SOI", Solid-State Device Research Conference, 2001. Proceeding of the 31st European., Sep. 11-13, 2001.

*Primary Examiner*—Mary Wilczewski
(74) *Attorney, Agent, or Firm*—Winston Hsu (57) ABSTRACT

A method of forming a MOS transistor, in which, a co-implantation is performed to implant a carbon co-implant into a source region and a drain region or a halo implanted region to effectively prevent dopants from over diffusion in the source region and the drain region or the halo implanted region, for obtaining a good junction profile and improving short channel effect, and the carbon co-implant is from a precursor comprising CO or $CO_2$.

10 Claims, 8 Drawing Sheets

U.S. PATENT DOCUMENTS

| | | | |
|---|---|---|---|
| 7,651,947 B2* | 1/2010 | Babich et al. | 438/705 |
| 7,666,771 B2* | 2/2010 | Krull et al. | 438/513 |
| 7,678,637 B2* | 3/2010 | Nandakumar et al. | 438/199 |
| 7,682,892 B2* | 3/2010 | Obradovic et al. | 438/199 |
| 7,700,467 B2* | 4/2010 | Bu et al. | 438/518 |
| 7,732,269 B2* | 6/2010 | Kim et al. | 438/197 |
| 7,736,983 B2* | 6/2010 | Kohli et al. | 438/303 |
| 2003/0109119 A1* | 6/2003 | Chakravarthi et al. | 438/563 |
| 2003/0207542 A1 | 11/2003 | Chidambaram | |
| 2004/0082151 A1* | 4/2004 | Chakravarthi et al. | 438/563 |
| 2004/0132260 A1 | 7/2004 | Lenoble | |
| 2005/0164461 A1* | 7/2005 | Chen et al. | 438/305 |
| 2006/0234455 A1* | 10/2006 | Chen et al. | 438/276 |
| 2006/0252239 A1 | 11/2006 | Hierlemann | |
| 2006/0270168 A1* | 11/2006 | Tan et al. | 438/289 |
| 2006/0284249 A1* | 12/2006 | Chen et al. | 257/344 |
| 2007/0037326 A1 | 2/2007 | Chen | |
| 2007/0148888 A1 | 6/2007 | Krull | |
| 2007/0284615 A1* | 12/2007 | Ku et al. | 257/196 |
| 2007/0298557 A1* | 12/2007 | Nieh et al. | 438/197 |
| 2008/0023732 A1* | 1/2008 | Felch et al. | 257/288 |
| 2008/0044960 A1* | 2/2008 | Al-Bayati et al. | 438/156 |
| 2008/0090393 A1* | 4/2008 | Aderhold et al. | 438/530 |
| 2008/0099852 A1* | 5/2008 | Faul | 257/382 |
| 2008/0146004 A1* | 6/2008 | Matocha et al. | 438/478 |
| 2008/0160683 A1* | 7/2008 | Vanderpool et al. | 438/142 |
| 2008/0258178 A1* | 10/2008 | Wang et al. | 257/228 |
| 2008/0293204 A1* | 11/2008 | Nieh et al. | 438/291 |
| 2008/0299749 A1* | 12/2008 | Jacobson et al. | 438/513 |
| 2009/0057759 A1* | 3/2009 | Obradovic et al. | 257/338 |
| 2009/0090982 A1* | 4/2009 | Ranade et al. | 257/408 |
| 2009/0179157 A1* | 7/2009 | Sinclair et al. | 250/423 R |
| 2009/0206281 A1* | 8/2009 | Oved et al. | 250/492.21 |
| 2009/0256160 A1* | 10/2009 | Liu et al. | 257/77 |
| 2009/0278209 A1* | 11/2009 | Noda | 257/408 |
| 2009/0286367 A1* | 11/2009 | Krull et al. | 438/221 |
| 2010/0003799 A1* | 1/2010 | Lee | 438/305 |
| 2010/0012988 A1* | 1/2010 | Yang et al. | 257/288 |
| 2010/0025576 A1* | 2/2010 | Adams | 250/288 |
| 2010/0105185 A1* | 4/2010 | Ku et al. | 438/301 |
| 2010/0109089 A1* | 5/2010 | Obradovic et al. | 257/369 |
| 2010/0133624 A1* | 6/2010 | Nandakumar et al. | 257/369 |

* cited by examiner

METHOD OF FORMING A MOS TRANSISTOR

CROSS REFERENCE TO RELATED APPLICATIONS

This is a continuation-in-part of U.S. application Ser. No. 12/127,787 filed on May 27, 2008, which is a continuation-in-part of U.S. application Ser. No. 11/278,434 filed on Apr. 3, 2006, now U.S. Pat. No. 7,396,717, and both are included herein by reference.

BACKGROUND OF THE INVENTION

1. Field of the Invention

The present invention relates to a method of forming a MOS transistor, and particularly to a method of forming a MOS transistor having an improved short channel effect.

2. Description of the Prior Art

Field effect transistors (FETs) are important electronic devices in the fabrication of integrated circuits, and as the size of the semiconductor device becomes smaller and smaller, the fabrication of the transistors is also improved and constantly enhanced for fabricating transistors with smaller sizes and higher quality.

In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. Finally, an anneal process is performed.

Figure 1:
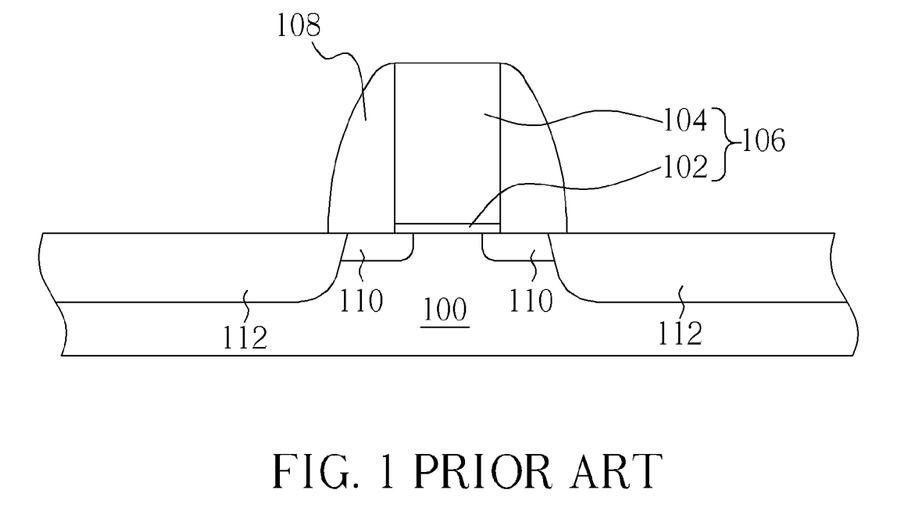
FIG. 1 is a schematic structural diagram showing a conventional field effect transistor.

Refer to FIG. 1, a schematic diagram showing a conventional field effect transistor. As shown in FIG. 1, a gate structure 106 having a gate dielectric layer 102 and a gate electrode 104 is first formed on a substrate 100. Next, an ion implantation process is performed to form a lightly doped drain 110 in the substrate 100. Next, a spacer 108 is formed on the sidewall of the gate structure 106 and another ion implantation is performed to form a source/drain region 112 in the substrate 100. Subsequently, a rapid thermal process (RTP) is performed to obtain a FET.

With the device scaling down, it's difficult to control the junction depth ($X_j$) and also reduce the access resistance. The short channel effect (SCE) noticeably depends on the junction depth. The junction depth for the source/drain of a transistor must be reduced to avoid the short channel effect of the MOS arisen from the shrinkage of the MOS size to increase the integration of the device. A lot of papers have demonstrated many approaches to improve the pFET SCE. But from 65 nm node and beyond, the conventional As (arsenic) implantation and spike RTP can hardly meet the nFET SCE requirement.

From the above viewpoint, the shallower as-implant depth by heavy ions or less diffusion activation tool is needed. Unfortunately the advanced activation tools (for example, flash or laser anneal) are under development and not mature.

A method of manufacturing a PMOS transistor has been disclosed to implant fluorine in a source/drain extension region or source/drain region to be with the dopants thereat together. The diffusion for the dopants can be improved during a subsequent annealing process, to alleviate the SCE.

However, because transistors with smaller sizes and higher quality are constantly desired, a method of manufacturing an FET with an improved SCE and a good junction profile is still needed.

SUMMARY OF THE INVENTION

One object of the present invention is to provide a method of forming a MOS transistor with an improved short channel effect.

In one embodiment of the present invention, the method of forming a MOS transistor comprises the steps as follows. First, a substrate having a gate thereon, a source region and a drain region therein with a channel region under the gate therebetween is provided. The source region and the drain region are pre-amorphized to form amorphized regions. A first ion implantation is performed to implant a first dopant in the source region and the drain region to form a first doped region. A spacer is formed on the sidewalls of the gate. A second ion implantation is performed to implant a second dopant in the source region and the drain region to form a second doped region. The source region and the drain region are annealed to activate the first dopant, regrow the amorphized regions to a substantially crystalline form, and form a junction profile. A co-implantation process is performed after the source region and the drain region are pre-amorphized and before the source region and the drain region are annealed, to implant a carbon co-implant in the source region and the drain region. The carbon co-implant is from a precursor comprising carbon monoxide (CO) or carbon dioxide ($CO_2$).

The method of forming a MOS transistor comprises a step of co-implantation to implant a carbon co-implant from a precursor comprising CO or $CO_2$ within substantially the same place as that of the lightly doped drain or source, the source region and the drain region, or the halo implanted region. Therefore, after a rapid thermal process is performed, for example, by a conventional implanter and a spike annealing tool, the diffusion of dopants co-existing with the carbon co-implants from the co-implantation can be reduced. That is, the diffusion of the dopants within the lightly doped drain or source, the source region and the drain region, or the halo implanted region can be effectively controlled, to obtain a good junction profile and an improved short channel effect.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
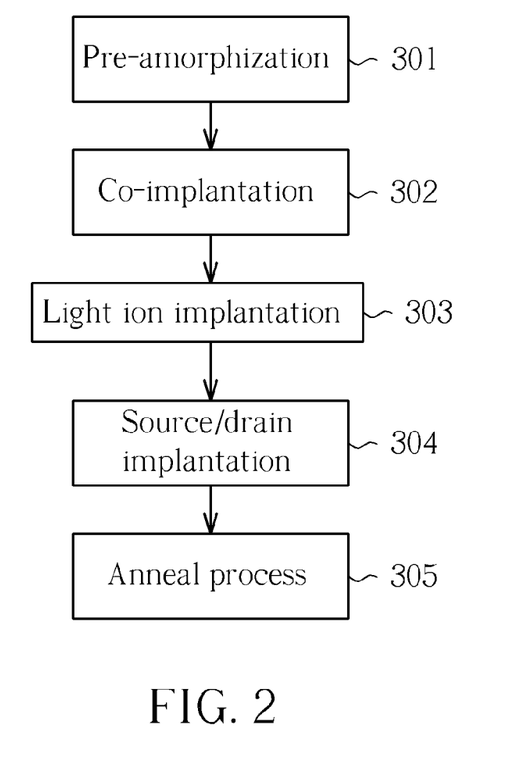
FIG. 2 is a flow chart showing the method of forming a MOS transistor according to the present invention.

Refer to FIGS. 2 to 6 for illustration of an embodiment according to the present invention. FIG. 2 is a flow chart showing the method of forming a MOS transistor according to the present invention. The method of forming a MOS transistor of the embodiment according to the present invention comprises the steps as follows. A substrate having a gate, a source region and a drain region, and a channel region is provided. A pre-amorphization 301 is performed to form an amorphized region in the source region and the drain region, respectively. A co-implantation 302 is performed to implant a carbon co-implant within the source region and the drain region. A light ion implantation 303 is performed to form a doped region in the source region and the drain region. A spacer is formed on the sidewall of the gate. A source/drain ion implantation 304 is performed to form a doped region. An anneal process 305 is performed to activate the dopants, regrow the amorphized regions to a substantially crystalline form, and form a junction profile.

Figure 3:
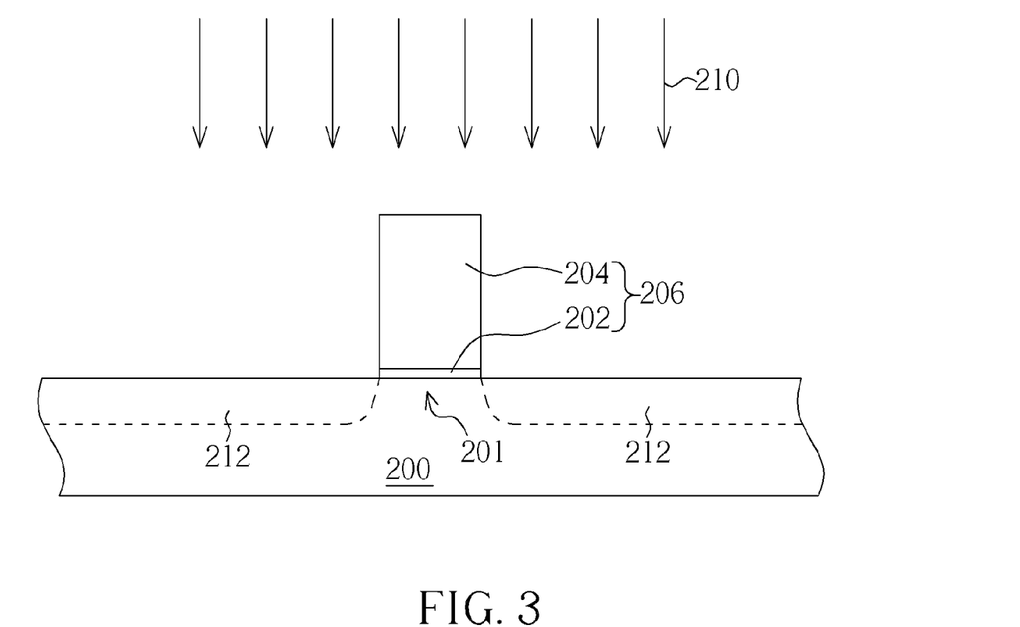
FIGS. 3 to 6 show cross sectional views for the method of forming a MOS transistor according to the present invention.

FIGS. 3 to 6 show cross sectional views for the method of forming a MOS transistor according to the present invention. As shown in FIG. 3, first, a substrate 200 is provided. A gate structure 206 comprises a gate dielectric layer 202 and a gate electrode 204 on the substrate 200. The gate dielectric layer 202 comprises dielectric material such as silicon oxide. The gate electrode 204 comprises a conductive material such as doped polysilicon. A source region and a drain region are defined at two sides of the gate structure 206, and a channel region 201 is under the gate structure 206. Next, the pre-amorphization 301 is performed to form an amorphized region 212 in the source region and the drain region, respectively, to destroy the lattice of the silicon crystalline into an amorphous structure. The pre-amorphizing implantation is performed by an ion implantation 210 through implanting an implant into the source region and a drain region. The implant may be, but not limited to, for example, silicon (Si), antimony (Sb), germanium (Ge), or arsenic (As). For example, a Ge implant having a dose of about $5.0 \times 10^{14}$ atoms/cm² with an implantation energy of about 40 KeV may be employed, or an As implant having a dose of about $3.0 \times 10^{15}$ atoms/cm² with an implantation energy of about 40 KeV may be employed. The implantation may be perpendicular to the implanted surface or with an angle as desired. An implantation angle of about 3 to 10 degrees may be used to generate an amorphized region extending to under the gate.

Figure 4:
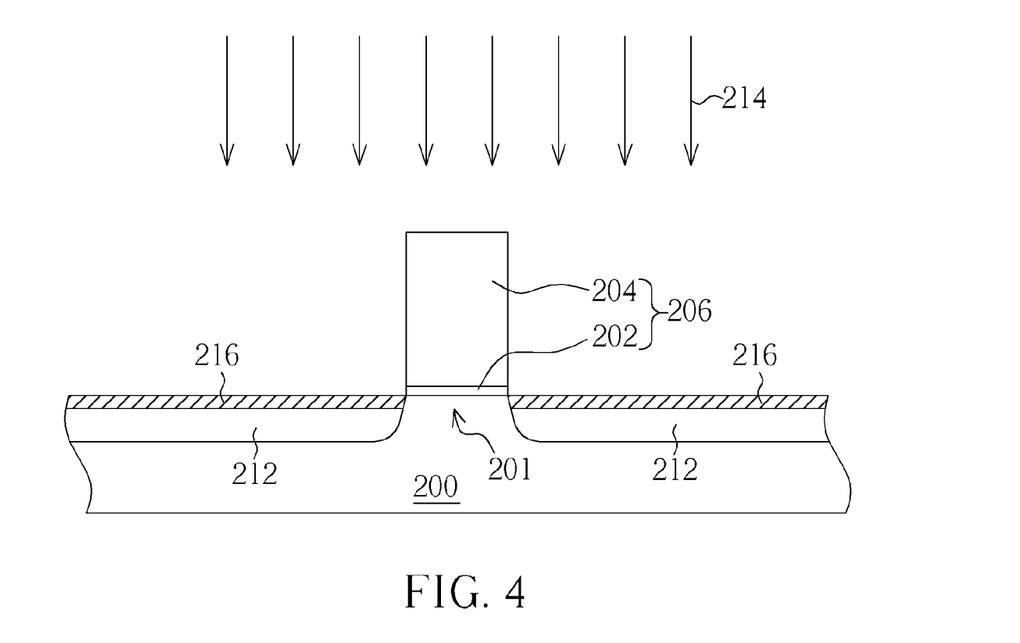

The co-implantation 302 is performed to implant a carbon co-implant into the source region and the drain region. For example, as shown in FIG. 4, the co-implantation is performed by an ion implantation 214 to form a co-doped region 216 in the light doped drain/source predetermined region. The place for the carbon co-implant in the substrate is not limited to the substantially same place as that of the subsequent dopant implanted by an LDD implantation, and it may be the substantially same place as that of the subsequent dopant implanted by a source/drain implantation. Thus, the short channel effect due to over diffusion of the dopants implanted by the subsequent processes during the anneal process such as the rapid thermal process can be reduced. The carbon co-implant is from a precursor comprising CO or $CO_2$. The precursor is dissociated in an implanter into a mixture including carbon cation. The carbon cation is then obtained through a separation process to serve as the carbon co-implant. The co-implantation energy may depend on the carbon co-implant position in the substrate, such as 1 KeV to 20 KeV, and preferably 5 KeV. The dosage may be $1 \times 10^{13}$ to $1 \times 10^{16}$ atoms/cm², preferably $1 \times 10^{14}$ to $1 \times 10^{15}$ atoms/cm², and more preferably $5 \times 10^{14}$ atoms/cm². A "quad implant" is preferred, wherein four steps of implantation are performed. Tilt angle of 0 to 60 degrees, and preferably 30 degrees, with respect to the normal direction may be used.

Figure 5:
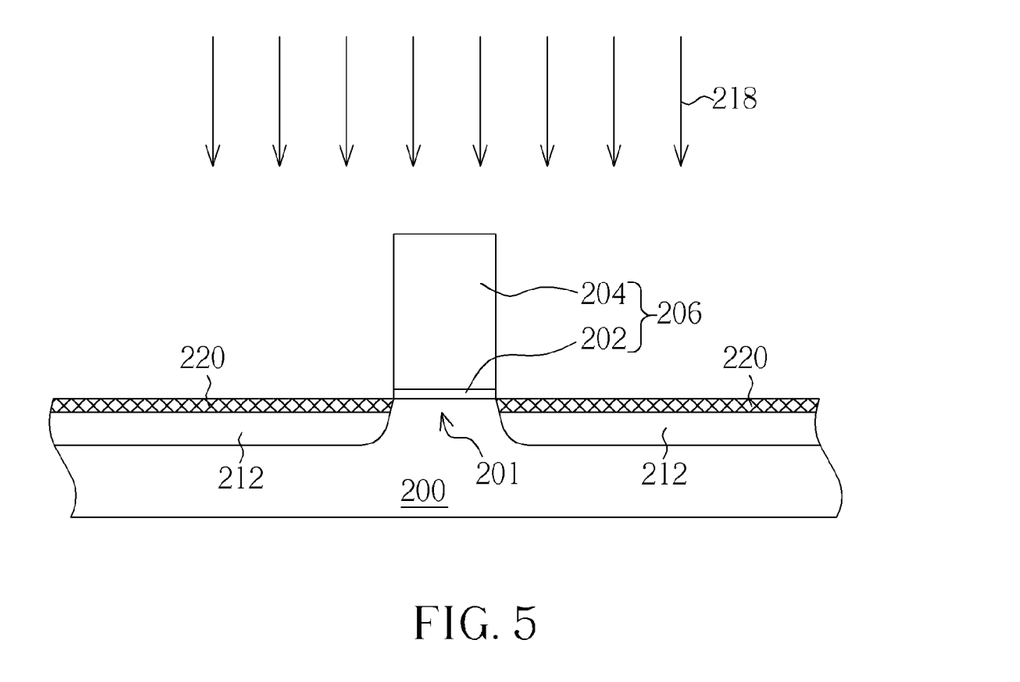

Referring to FIG. 5, the LDD implantation 303 is performed by an ion implantation 218 using the gate 204 as a mask to implant a light dopant into the amorphized region 212 to form a light source/drain region (LDD) 220. In this embodiment, a carbon co-implant exists in LDD 220. The dopant used in the light ion implantation may be for example As or P as a light dopant for the source/drain region to form an n-type LDD (NLDD), or for example B, $BF_2$, $B_wH_z^+$, or $(B_wH_z)_m^+$ as a light dopant for the source/drain region to form an p-type LDD (PLDD), in which, w is a number of 2 to 30, and preferably 18, z is a number of 2 to 40, and preferably 22, and m is a number of 10 to 1000, and preferably 800. The dose for the light dopant may be, for example, $10^{17}$ to $10^{20}$ atoms/cm³.

After the LDD implantation, a spike rapid thermal process may be further performed to activate dopants. Alternatively, the spike rapid thermal process is not performed at this manufacturing stage, and an anneal process is performed after the source/drain implantation.

Figure 6:
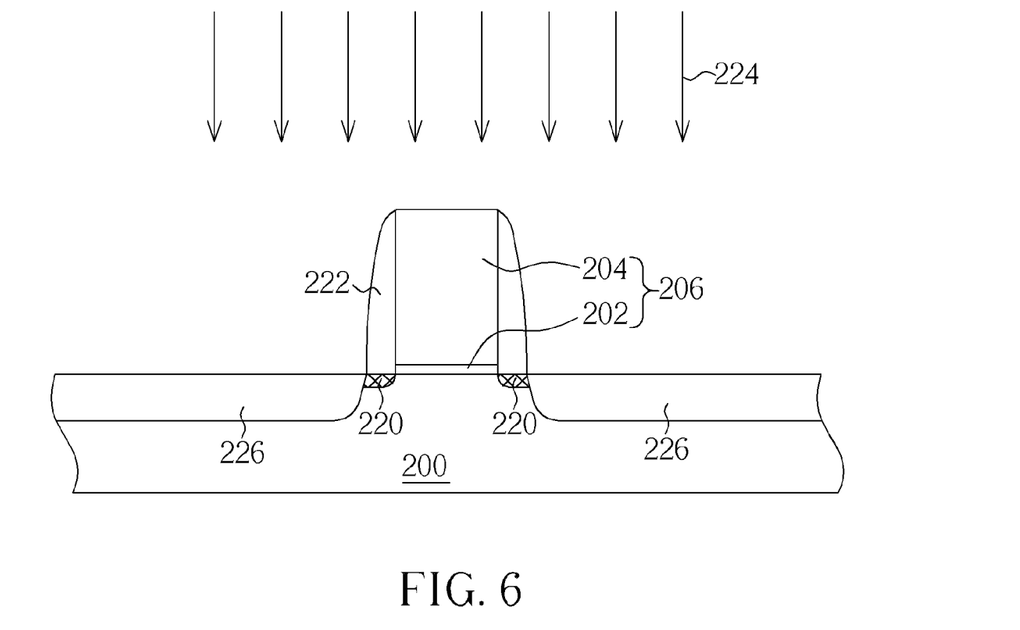

Subsequently, the source/drain implantation 304 is performed. As shown in FIG. 6, a spacer 222 is formed on the sidewall of the gate structure 206. The spacer may be a single layer or a multi-layered structure. For example, the spacer may be composed of a lining layer (such as silicon oxide) and a silicon nitride layer or the spacer may be composed of a silicon oxide offset spacer and a silicon nitride spacer. Thereafter, an ion implantation 224 is performed to implant a heavy dopant within the source region and the drain region to form a heavily doped source/drain 226. The implantation dose of the heavy dopant may be for example $10^{20}$ to $10^{21}$ atoms/cm³.

Finally, the anneal process 305 is performed, such as a rapid thermal process, or a spike anneal process to activate the dopant in the substrate 200 at a high temperature of, for example, 1000 to 1050° C. to form a desired junction profile and regrow the damaged lattice structure of the surface of the substrate 200 caused by ion implantations to a substantially crystalline form.

Figure 12:
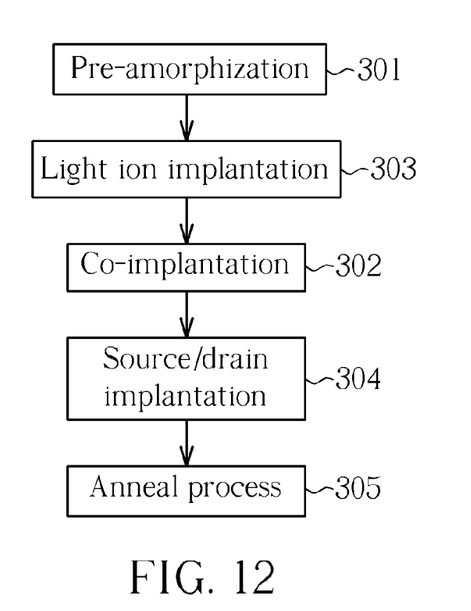
Figure 13:
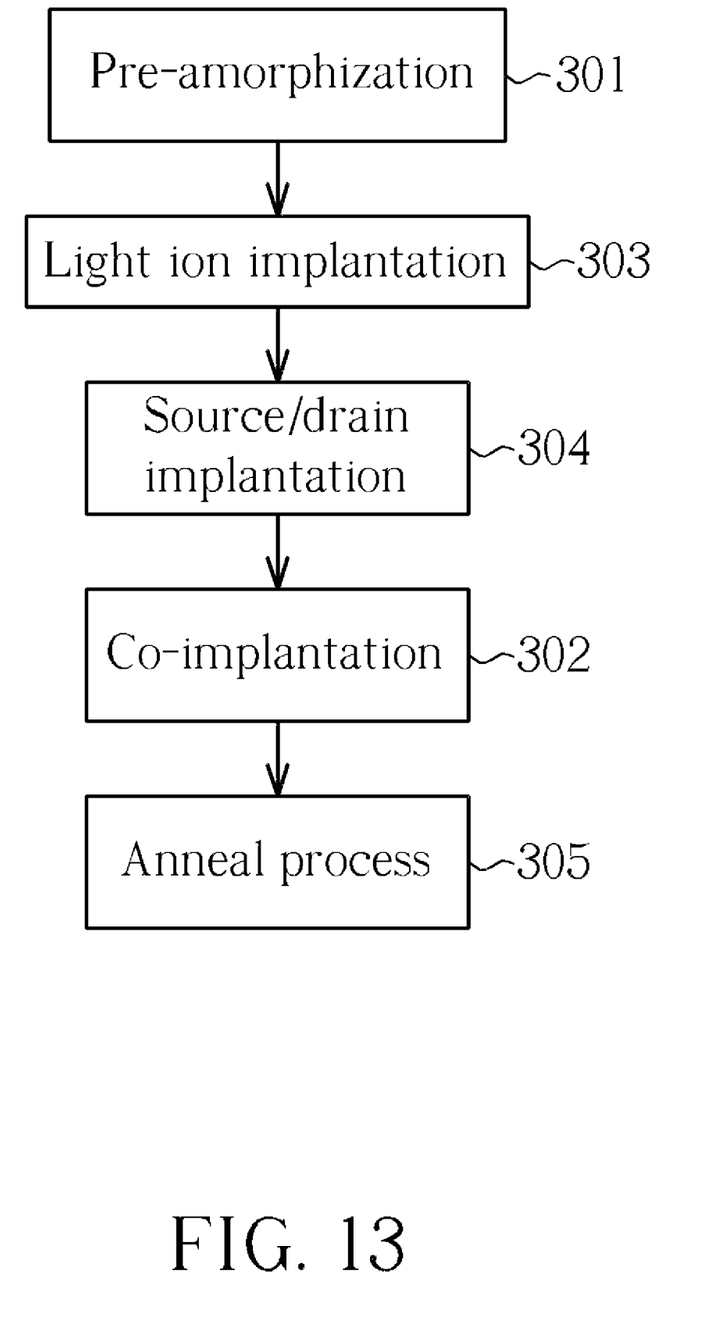

In the flow chart shown in FIG. 2, the co-implantation 302 is performed after the pre-amorphization 301 and before the light ion implantation 303; however, it is noted that the diffusion of dopants in the substrate can be well controlled as long as the co-implantation 302 is performed before the anneal process 305. Accordingly, the co-implantation 302 may be performed after the pre-amorphization 301 and before the light ion implantation 303; or after the light ion implantation 303 and before the source/drain implantation 304, as shown in FIG. 12; or after the source/drain implantation 304 and before the anneal process 305, as shown in FIG. 13. Therefore, the carbon co-implant is implanted in the substrate 200 at a place substantially the same as that of the light dopant in the lightly doped region or that of the heavy dopant in the source/drain.

Figure 7:
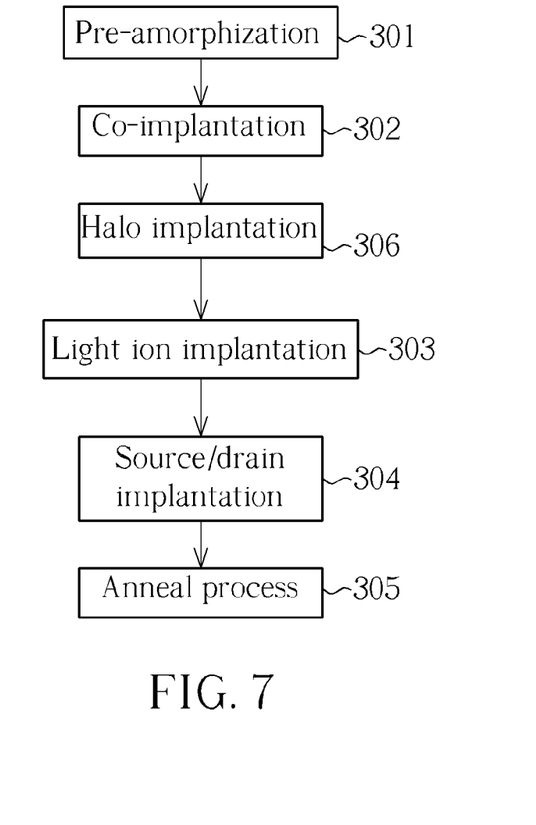
FIG. 7 is a flowchart showing another embodiment of the method of forming a MOS transistor according to the present invention.

Referring to FIG. 7, a flow chart showing another embodiment of the method of forming a MOS transistor according to the present invention has the same steps as the above-described embodiment, except that a halo implantation is further comprised. A halo implant, also called a "pocket implant," has been used to reduce "punch through", i.e., to limit lateral diffusion of the source and the drain dopants in MOS transistors. It is generally performed after the gate is defined and before the source/drain diffusion. Due to the masking effect of the gate, the halo implant peak concentration is near the source/drain region. Away from the source/drain edge, under the gate, the depth of the peak halo concentration falls quickly.

Figure 11:
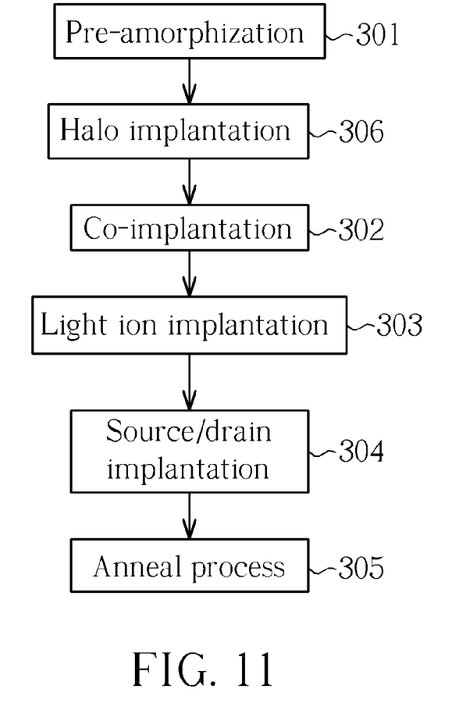
FIGS. 11-13 are flow charts showing some embodiments of the method of forming a MOS transistor according to the present invention.

As shown in FIG. 7, the halo implantation 306 is performed after the co-implantation 302 and before the light ion implantation 303. Nevertheless, it also can be performed after the pre-amorphization 301 and before the co-implantation 302, as shown in FIG. 11. The halo implant is of the conductivity type opposite to that of the source and drain of the MOS device. For example, As is used as a dopant in LDD and B or $BF_2$ may be used as a halo implant to form an nFET. B or $BH_2$ is used as a dopant in LDD and As or P may be used as a halo implant to form a pFET. The concentration of the halo implant in the halo implanted region depends on the device size. The concentration is higher as the size is larger. The concentration may be between $1 \times 10^{17}$ atoms/cm$^3$ and $1 \times 10^{18}$ atoms/cm$^3$, for example. The ion flux may be at an implant angle of 0 to about 30 degrees, or greater, with respect to the normal line (perpendicular) to the substrate, to provide a halo implant which extends slightly under the gate.

Figure 8:
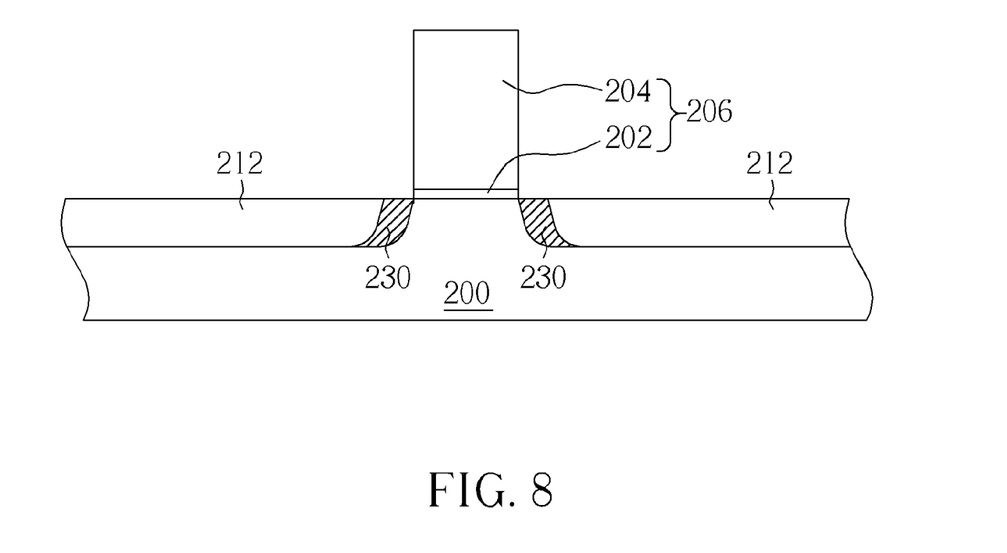
FIG. 8 shows a cross sectional view for the method of forming a MOS transistor according to the present invention, in which the halo implanted region comprises dopants and implants.

In case the halo implantation is included to form the transistor, the carbon co-implant may be implanted in the substrate 200 at a place substantially the same as that of the halo implant, in addition to the place substantially the same as that of the light dopant in the lightly doped region or that of the heavy dopant in the source/drain. FIG. 8 shows an embodiment in which the halo implanted region 230 comprises a carbon co-implant, in addition to the halo implant. Thus, the diffusion of the halo implant can be well controlled to form a better junction profile.

When carbon co-implant exists with dopants together, the diffusion of the dopants (such as, B or P) can be controlled because the carbon co-implant occupies the interstitials of the silicon crystalline structure. This situation facilitates the control for the diffusion of dopants, and thus a good junction profile can be obtained.

Figure 9:
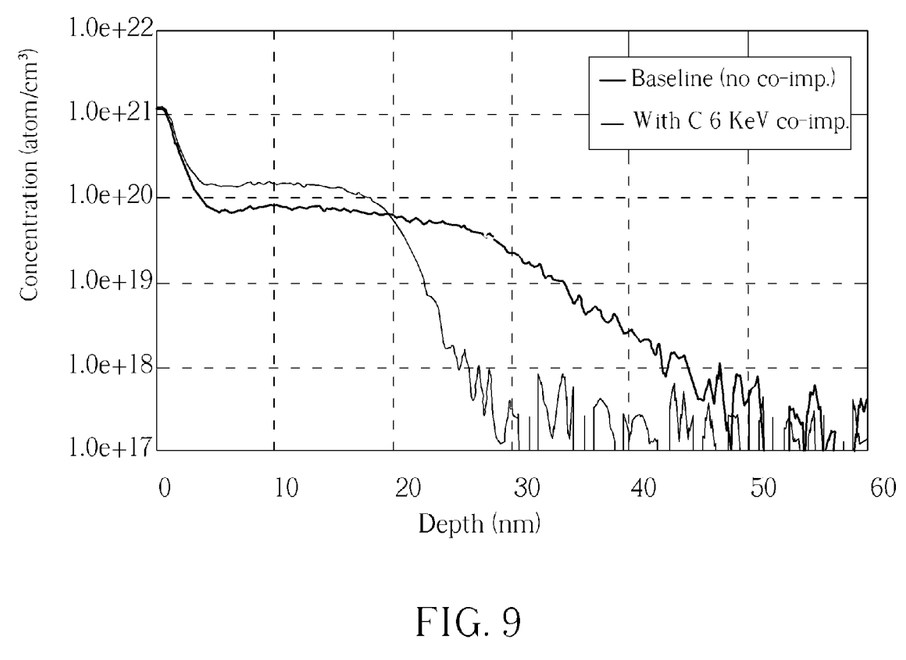
FIG. 9 shows the B profile comparison by a secondary ion mass spectroscopy of PLDD made using the method according to the present invention and PLDD made by a conventional method.

FIG. 9 shows the B profile comparison by a secondary ion mass spectroscopy (SIMS) of PLDD made in one embodiment of the method of forming a MOS transistor according to the present invention, with carbon co-implant, and PLDD made by a conventional method, without a co-implantation. Both utilized $BF_2$ of 3 KeV as a dopant for the PLDD implantation, but in the embodiment according to the present invention, a co-implantation was further performed using a carbon co-implant of 6 KeV. As shown in FIG. 9, carbon co-implant was utilized to reduce the diffusion of B for forming a shallower and a sharper junction. In comparison with the conventional co-implantation using fluorine, the method of the present invention is more effective on the reduction of B diffusion.

Figure 10:
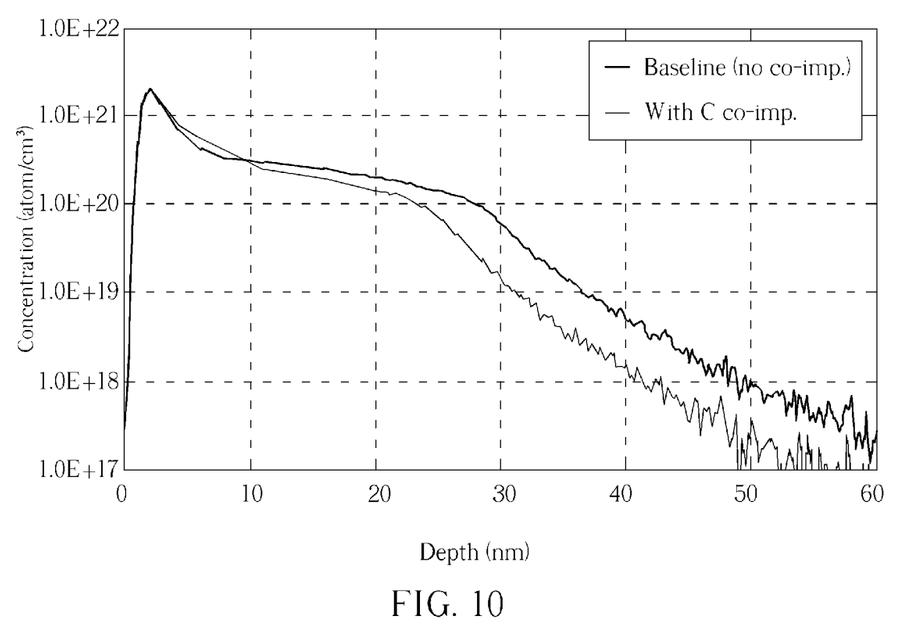
FIG. 10 shows the As profile comparison by a secondary ion mass spectroscopy of NLDD made using the method according to the present invention and NLDD made by a conventional method.

FIG. 10 shows the As profile comparison by a secondary ion mass spectroscopy (SIMS) of NLDD made in one embodiment of the method of forming a MOS transistor according to the present invention, with carbon co-implant, and PLDD made by a conventional method, without a co-implantation. Both utilized As of 4 KeV as a dopant in a dose of $1.5 \times 10^{15}$ atoms/cm$^3$ for the NLDD implantation, but in the embodiment according to the present invention, a co-implantation was further performed using carbon co-implant of 3 KeV. As shown in FIG. 10, carbon co-implant was utilized to reduce the diffusion of As for forming a shallower and a sharper junction.

All combinations and sub-combinations of the above-described features also belong to the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a MOS transistor, comprising:
   providing a substrate having a gate thereon, a source region and a drain region therein with a channel region under the gate therebetween;
   pre-amorphizing the source region and the drain region to form amorphized regions;
   performing a first ion implantation to implant a first dopant in the source region and the drain region to form a first doped region;
   forming at least a spacer on the sidewalls of the gate;
   performing a second ion implantation to implant a second dopant in the source region and the drain region to form a second doped region;
   annealing the source region and the drain region to activate the first dopant, regrow the amorphized regions to a substantially crystalline form, and form a junction profile; and
   performing a co-implantation process, after pre-amorphizing the source region and the drain region and before annealing the source region and the drain region, to implant a carbon co-implant in the source region and the drain region, wherein the carbon co-implant is from a precursor comprising CO or $CO_2$.

2. The method of claim 1, wherein the carbon co-implant is implanted in the substrate at a place substantially the same as that of the first dopant or the second dopant.

3. The method of claim 1, further, after pre-amorphizing the source region and the drain region and before performing the first ion implantation, comprising:
   performing a halo implantation to implant a third dopant between the channel region and the source region and between the channel region and the drain region.

4. The method of claim 3, wherein the carbon co-implant is implanted in the substrate at a place substantially the same as that of the first dopant, the second dopant, or the third dopant.

5. The method of claim 3, wherein the co-implantation process is performed after pre-amorphizing the source region and the drain region and before performing the halo implantation.

6. The method of claim 3, wherein the co-implantation process is performed after performing the halo implantation and before performing the first ion implantation.

7. The method of claim 1, wherein the co-implantation process is performed after pre-amorphizing the source region and the drain region and before performing the first ion implantation.

8. The method of claim 1, wherein the co-implantation process is performed after performing the first ion implantation and before performing the second ion implantation.

9. The method of claim 1, wherein the co-implantation process is performed after performing the second ion implantation and before annealing the source region and the drain region.

10. The method of claim 1, wherein the first dopant comprises B, $BF_2$, $B_wH_z^+$, or $(B_wH_z)_m^+$, wherein w is a number of 2 to 30, z is a number of 2 to 40, and m is a number of 10 to 1000.

* * * * *